United States Patent [19]
Shirley et al.

[11] Patent Number: 5,677,878
[45] Date of Patent: Oct. 14, 1997

[54] METHOD AND APPARATUS FOR QUICKLY RESTORING DIGIT I/O LINES

[75] Inventors: Brian M. Shirley; Kevin G. Duesman, both of Boise, Id.

[73] Assignee: Micron Technology, Inc., Boise, Id.

[21] Appl. No.: 587,472

[22] Filed: Jan. 17, 1996

[51] Int. Cl.[6] .................................................. G11C 7/00
[52] U.S. Cl. ............................ 365/189.11; 365/205
[58] Field of Search ................................ 365/189.11, 205

[56] References Cited

U.S. PATENT DOCUMENTS

| | | | |
|---|---|---|---|
| 5,280,452 | 1/1994 | Dhong et al. | 365/205 |
| 5,285,408 | 2/1994 | Starkweather et al. | 365/189.11 |
| 5,386,389 | 1/1995 | Taoka | 365/205 |

FOREIGN PATENT DOCUMENTS

| | | | |
|---|---|---|---|
| 82398 | 4/1986 | Japan | 365/205 |
| 37890 | 2/1988 | Japan | 365/205 |
| 308790 | 12/1988 | Japan | 365/205 |

*Primary Examiner*—David C. Nelms
*Assistant Examiner*—Trong Quang Phan
*Attorney, Agent, or Firm*—Schwegman, Lundberg, Woessner & Kluth, P.A.

[57] ABSTRACT

A helper flip-flop device is coupled to a pair of I/O DIGIT lines in a DC bias current sensing based dynamic random access memory (DRAM) device for ensuring that one of the DIGIT lines returns to as low a voltage as possible following a memory access. A sense amplifier is coupled to the I/O lines to amplify the differential voltage appearing on the lines following access of a memory cell. The helper flip-flop, when activated at the same time the DC bias is removed, sinks current from the low line to ground, effectively reducing its voltage to near ground to allow faster release of the row access signal.

19 Claims, 3 Drawing Sheets

METHOD AND APPARATUS FOR QUICKLY RESTORING DIGIT I/O LINES

FIELD OF THE INVENTION

The present invention relates to a method and apparatus for restoring DIGIT lines of a semiconductor memory device, and in particular to the use of a circuit to quickly pull down one of the DIGIT lines to correctly latch data.

BACKGROUND OF THE INVENTION

Most modem day dynamic random access memory (DRAM) devices use a well known set of circuits in an array of memory cells to sense a small charge from a chosen memory cell. The charge is amplified to a much larger, full-rail voltage on a pair of digit lines. Such circuitry, called sense amplifiers, essentially function as enabled flip-flops. A well known enhancement of the basic sense amplifier is the addition of isolation gates between the digit lines and n-channel sense amplifier devices. Such isolation gates, referred to as ISO gates, resistively shelter the digit line capacitance from the n-sense amplifier, and thus allow the sense amplifier to sense and latch the correct data much more quickly. To read and write a particular digit line pair, a decoded Y-gate is then turned on, coupling the digit line pair to an I/O line pair.

A variety of techniques are used to amplify the data once the I/O line pair is coupled to the digit line pair. Earlier designs used circuits coupled to the I/O lines that were identical to the digit line sense amplifiers. Such circuits were termed helper flip-flops, and functioned by sensing, amplifying and then latching the I/O line data.

Newer techniques perform this function by resistively tying both I/O lines to the power supply voltage to provide a DC bias current, and then allowing the digit line sense amplifier to pull one of the I/O lines to a lower level. The I/O lines are thus not latched or driven by any additional circuits, except for the digit line sense amplifiers. Such techniques avoid the timing problems associated with helper flip-flop techniques, such as the possibility of trying to sense and latch too early, and thus irreversibly latching wrong data on the I/O line.

One feature of this technique is that DC current flows from the power supply voltage, through the bias devices, through the Y-gate, through the ISO gates, and finally through the n-sense amplifier device to ground. This DC current allows one of the I/O lines to resistively divide down to a lower voltage, but unfortunately also allows the low digit line to pull up to a voltage higher than ground. When a row access signal (RAS) is taken high to deactivate the DRAM, the Y-gate is turned off, and the low digit line decays to a ground potential through the n-sense amplifier. It is undesirable to decouple the memory cell from the digit line by shutting off the row line until the low digit line has decayed to an acceptable low level to avoid writing incorrect data back into the memory cell.

As DRAM densities increase, the digit line capacitance grows due to longer digit lines as well as tighter spacing. Additionally, the resistance of the ISO device increases to provide further protection for the n-sense amplifier. Hence, the RC time constant that determines the decay time becomes larger, and can be so long as to adversely affect the overall speed grade of the DRAM.

There is therefore a need to return the low digit line to a ground potential as quickly as possible once the DRAM is deactivated. There is a further need to do this with as little circuitry as possible, since chip area is at a premium.

SUMMARY OF THE INVENTION

A helper flip-flop device is coupled to a pair of I/O DIGIT lines in a dynamic random access memory (DRAM) device that uses a DC bias sensing approach for ensuring that a DIGIT line returns to a low voltage as quickly as possible to allow latching of the value on the DIGIT line which is representative of the value in a selected memory cell coupled to the DIGIT line. The helper flip-flop sinks current from the low DIGIT line to ground, effectively reducing its voltage to a desired reference, such as ground. The helper flip-flop is activated when a row access signal (RAS) goes high. The time to restore the DIGIT line to the low voltage state is greatly improved, allowing the row signal to be shut off more quickly without latching incorrect data from the DIGIT lines.

In one embodiment, the helper flip-flop comprises a pair of enhancement mode, n-channel field effect transistors, having their gates cross coupled to the drains of the transistors, which are then each coupled to a different one of the pair of I/O lines. One of the I/O lines is used as the actual DIGIT line coupled to a memory cell, and the other is used as an inverse reference voltage. The transistors are activated by application of a RESTORE signal to the gate of a transistor coupled between the sources of the flip-flop transistors and ground, thus providing a direct path to ground for the I/O line having the lowest voltage.

In a further embodiment, a helper flip-flop is attached to each column I/O pair on the DRAM. It thus provides the direct path to ground for multiple DIGIT lines coupled to the I/O lines, conserving space on the memory chip and allowing higher capacity memory chips with improved access times. The helper flip-flop is inactive until RAS goes high, and is then activated, pulling one column and the DIGIT line it is coupled to, all the way to ground as quickly as possible. This is accomplished prior to the column decoder gate being shut off. Pulling the low DIGIT line to ground essentially increases the difference between the low and high DIGIT lines, making it easier to latch correct data. One further benefit of the present invention, is that writes which were in progress when RAS goes high will be quickly finished. It may also be used to assist in page mode writes by setting RESTORE high once the written data has crossed the I/O lines.

DESCRIPTION OF THE EMBODIMENTS

In the following detailed description, reference is made to the accompanying drawings which form a part hereof, and in which is shown by way of illustration specific embodiments in which the invention may be practiced. These embodiments are described in sufficient detail to enable those skilled in the art to practice the invention, and it is to be understood that other embodiments may be utilized and that structural, logical and electrical changes may be made without departing from the spirit and scope of the present invention. The following detailed description is, therefore, not to be taken in a limiting sense, and the scope of the present invention is defined by the appended claims.

Numbering in the Figures is usually done with the hundreds and thousands digits corresponding to the figure number, with the exception that the same components may appear in multiple figures. Signals and connections may be referred to by the same number or label, and the actual meaning should be clear from the context of use.

Figure 1:
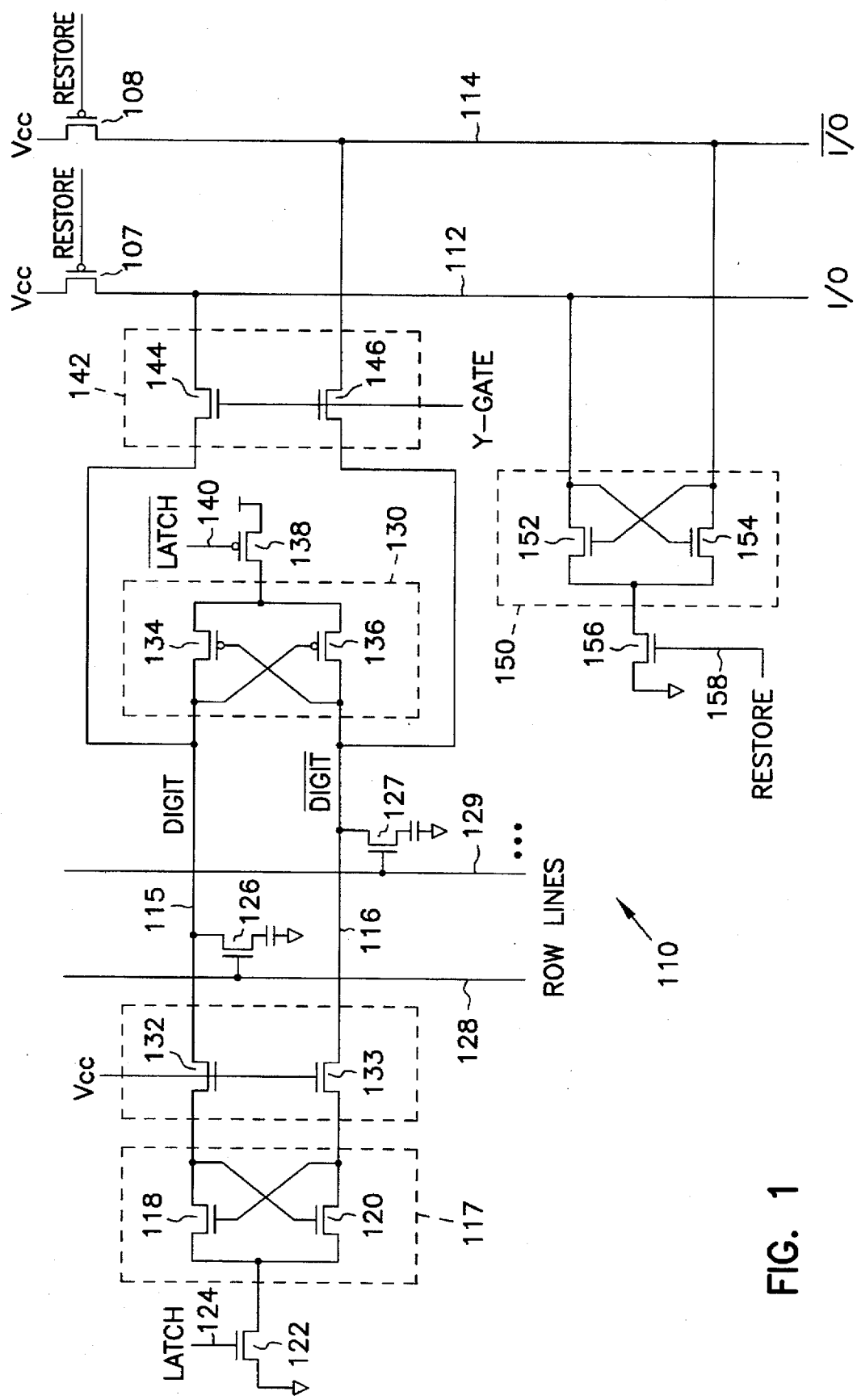
FIG. 1 is schematic diagram of sense amplifier circuitry and circuitry for pulling an I/O line to a desired voltage in accordance with the present invention.

Sensing circuitry associated with sensing and resetting of I/O lines is indicated generally at 110 in FIG. 1. A pair of I/O lines 112 and 114 are coupled through a gate to a corresponding pair of DIGIT lines 115 and 116, which in turn are coupled to memory cells 126 and 127 of a dynamic random access memory (DRAM). The I/O lines 112 and 114 are also resistively coupled to Vcc through a respective pair of p-channel transistors 107 and 108 respectively to provide a DC bias current for secondary sensing on the I/O lines. Further sets of DIGIT lines are also coupled to the I/O lines but are not shown. The memory cells 126 and 127 are coupled to the DIGIT lines and selected in a well known manner via row lines 128 and 129 respectively. Multiple memory cells and row lines are coupled to the DIGIT lines. Only the memory cell selected by a single row line will affect the voltage on the DIGIT lines. Only one of the I/O lines will be actively coupled via a DIGIT line to a memory cell, allowing the other line to be used as a reference voltage. Thus, a single memory access activates only one of the I/O lines.

In order to both read and refresh data in a memory cell, the charge of the cell must be sensed and amplified. An n-sense amplifier is provided generally at 117, and comprises a pair of cross coupled n-channel enhancement mode field effect transistors 118 and 120. The sources of both transistors are coupled through a n-channel transistor 122 to Vss, the ground, by application of a LATCH signal at 124. N-sense amplifier 117 is electrically isolated from a p-sense amplifier 130 via a pair of isolation gates 132 and 133.

P-sense amplifier 130 comprises a pair of cross coupled p-channel enhancement mode field effect transistors 134 and 136. The sources of both the p-sense transistors are coupled through a p-channel transistor 138 to Vcc, the supply voltage by application of the complement of the LATCH signal at 140.

The sense amplifiers are coupled to the I/O channels 112 and 114 via a column decoder gate 142 comprising transistors 144 and 146 respectively by application of a y-gate signal coupled to both gates of transistors 144 and 146. The y-gate signal serves to control the coupling of the sense amplifiers at the DIGIT lines to the I/O lines, allowing the sense amplifiers to force the I/O lines to different voltages to reflect the value in the memory cell.

Also coupled to the I/O lines 112 and 114 is a helper circuit 150 comprising a pair of cross coupled n-channel enhancement mode field effect transistors 152 and 154. They function as a flip flop device, and are coupled to ground through a n-channel transistor 156, also referred to as a switch transistor, under control of a RESTORE signal at 158. When the RESTORE line is asserted by well known memory control circuitry which is represented by the word "RESTORE," the higher of the I/O lines rams on the transistor coupled in series between the other I/O line and ground, pulling that I/O line to ground very quickly. Any type of flip flop device may be used to accomplish the function of pulling the I/O line to ground very quickly. In a further embodiment, a p-channel flip flop similar to p-sense amplifier 130 is included in helper circuit 150 to keep the high I/O line high. It is coupled to both I/O lines and operates in a well known manner similarly to the operation of p-sense amplifier 130. Helper flip flops have been used in the art essentially as sense amps in non-DC biased sensing schemes to assist in reading data by forcing the low and high I/O lines to ground and Vcc respectively.

Figure 2:
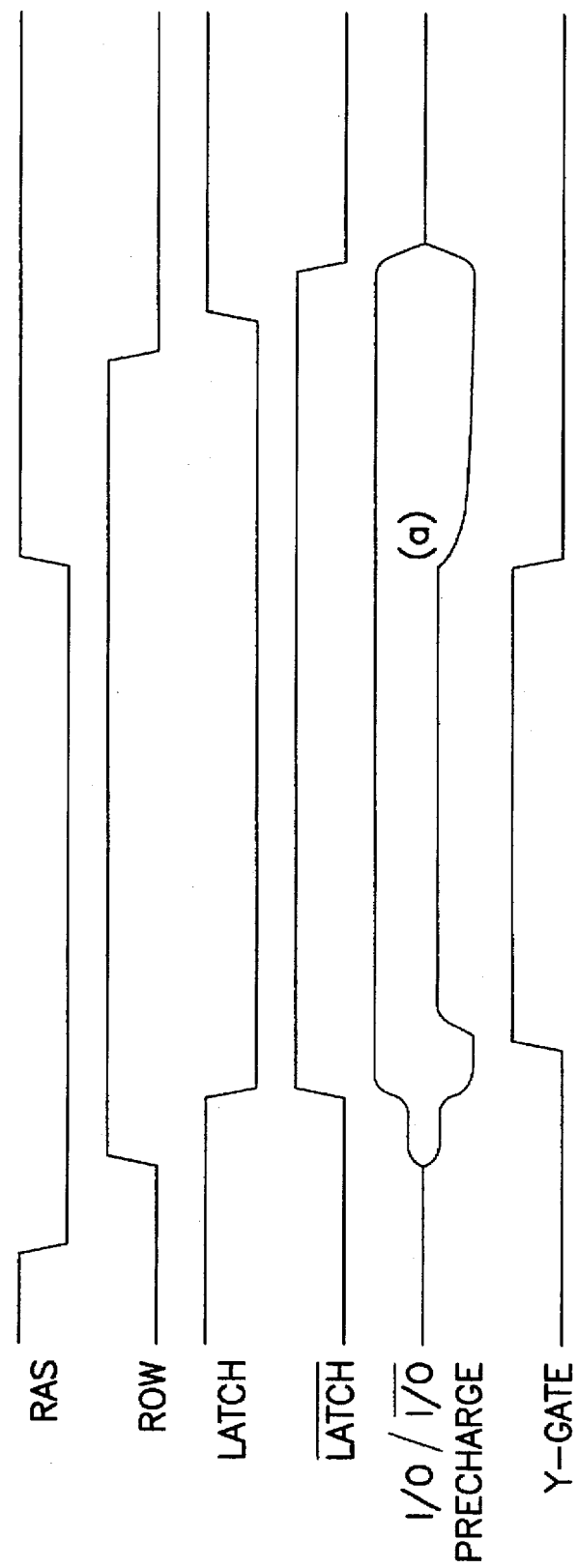
FIG. 2 is a prior art timing diagram of signals associated with prior art sense amplifier circuitry.

A prior an timing diagram is shown in FIG. 2, with signal names corresponding to those shown in FIG. 1, but absent the helper circuit 150. A row access signal, RAS is raised, As seen in the prior art timing diagram, the low DIGIT line returned to ground with a significant delay due to the increased capacitance of the DIGIT lines and increased resistance of the isolation gates 117 with new generations of DRAM devices. With the y-gate turned off, both the resistance and capacitance of the only path for the DIGIT were increased, resulting in a higher RC time delay constant and associated long decay time as indicated at time (a). A ROW signal for accessing the memory cell is only turned off when the DIGIT lines has sufficiently decayed, resulting in increased memory access times.

Figure 3:
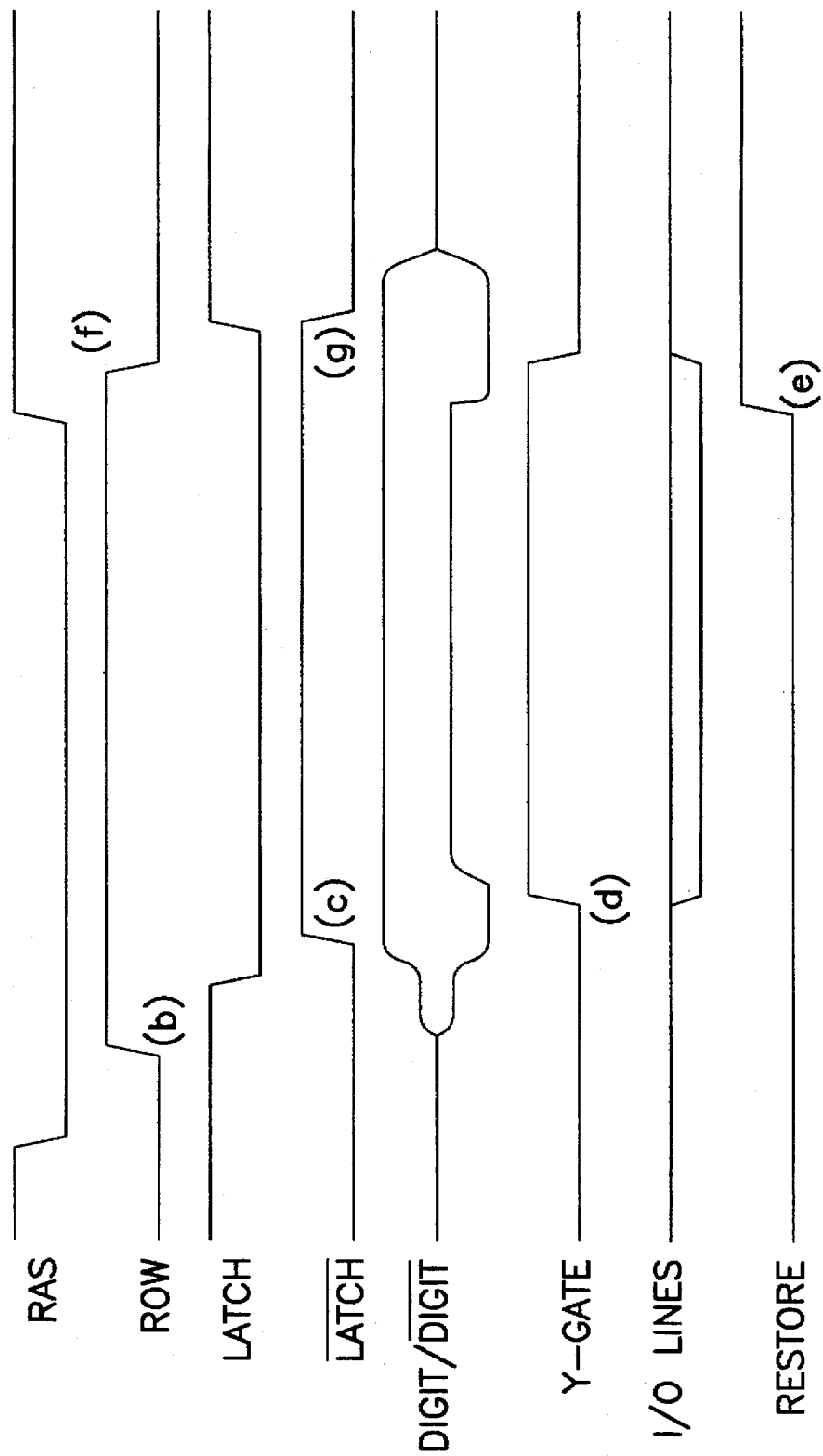
FIG. 3 is a timing diagram of signals associated with the circuitry of FIG. 1.

In the timing diagram of FIG. 3, which corresponds to the circuit of FIG. 1 and is not represented as an accurate portrayal of actual performance, the low DIGIT and I/O line returns to ground much more quickly. The I/O lines are initially biased by transistors 107 and 108 to approximately the supply voltage, Vcc. The DIGIT lines have been precharged to approximately ½ Vcc in a manner well known in the art. When ROW is asserted at time (b), the memory cell discharge causes the DIGIT lines to drift oppositely away from the precharge voltage. When transistor 122 is on, it causes the n-sense amplifier 117 and the p-sense amplifier 130 to pull the DIGIT lines to ground and Vcc respectively, essentially sensing the data in the memory cell. If the memory cell held no charge it sinks current, and the DIGIT line coupled to it is pulled or forced to ground. If the memory cell did hold a charge, the DIGIT line is pulled to Vcc.

The y-gate signal is asserted at time (d), causing a connection between the DIGIT lines and the I/O lines. The low DIGIT line then drifts to a voltage which may be in the range of ⅓ to ½ of Vcc. This is due to the high bias level applied to the I/O lines being resistively divided over the y-gate 142, the isolation gates and the n-sense amplifier 117. The low DIGIT line causes a decrease in voltage from Vet on the I/O line it is coupled to as reflected in FIG. 3 at time (d).

RAS is then raised so that at time (e) the RESTORE signal is raised, controllably activating the helper circuit 150 and turning off biasing transistors 107 and 108. Due to the differential voltage on the I/O lines, one of the transistors 152 and 154 is turned on, forcing current on the lower I/O line to flow through that transistor and through transistor 156 to ground. This causes the low I/O line, and the DIGIT line it is coupled to, to return quickly to ground as indicated shortly following time (e) in the timing diagram. It then allows the ROW signal to be unasserted at (f), decoupling the memory cell from the DIGIT line and the I/O lines. The ROW signal may be asserted much more quickly than in the prior art FIG. 2 timing diagram due to the DIGIT line returning to ground more quickly. The LATCH signals are then unasserted around time (g), essentially decoupling the sense amplifiers from the DIGIT lines and the sense amplifier circuit is returned to its original state and waits for the next memory access.

In a further embodiment of the present invention, the helper flip flop is used to assist in page mode writes by raising the RESTORE signal once the written data has crossed the I/O lines. This again causes the DIGIT line with the low signal level to return to a ground voltage level much more quickly, allowing the memory operation to be concluded in a shorter time with increased reliability.

It should be noted that in many field effect transistors, the source and drain are essentially interchangeable, and interconnections specified herein should not be interpreted as solely limited to those described. In addition, while some transistors were described as an n-channel transistor, it is recognized by those skilled in the art that a p-channel transistor be used.

The above description is intended to be illustrative, and not restrictive. Many other embodiments will be apparent to those of skill in the art upon reviewing the above description. The scope of the invention should, therefore, be determined with reference to the appended claims, along with the full scope of equivalents to which such claims are entitled.

What is claimed is:

1. A sensing circuit for a dynamic random access memory device operating under control of a row access signal, comprising:

first and second DIGIT lines coupled to independent memory cells in said memory device;

a sense amplifier selectively coupled to both of DIGIT lines for amplifying a difference in voltage between the two DIGIT lines;

first and second I/O lines selectively coupled to the DIGIT lines and resistively coupled to Vcc to provide a DC bias current; and a helper circuit coupled to the I/O lines for returning the DIGIT line with the lower voltage to a reference voltage when said helper circuit is activated in response to the row access signal being raised.

2. The sensing circuit of claim 1 wherein the helper circuit comprises a flip-flop circuit coupled to ground.

3. The sensing circuit of claim 2 wherein the flip-flop comprises a pair of cross coupled n-channel enhancement mode field effect transistors.

4. The sensing circuit of claim 2 wherein the transistors are coupled to a switch transistor which in turn is coupled to ground, and wherein said switch transistor has a gate coupled to receive a RESTORE signal for activating the switch transistor.

5. The sensing circuit of claim 1 and further comprising a gating circuit coupled between the sense amplifier and the I/O lines for selectively coupling the sense amplifier to the I/O lines in response to a column of the memory being selected.

6. The sensing circuit of claim 5 wherein the sense amplifier comprises:

a pair of DIGIT lines respectively coupled to the pair of I/O lines through the gating circuit;

a p-sense amplifier coupled to the DIGIT lines and to Vcc; and a n-sense amplifier coupled to the DIGIT lines and to ground.

7. The sensing circuit of claim 6 wherein the sense amplifier further comprises a pair of isolation gates coupled between the n-sense amplifier and the p-sense amplifier.

8. The sensing circuit of claim 6 wherein the n-sense amplifier comprises a pair of cross coupled n-channel enhancement mode field effect transistors, and the p-sense amplifier comprises a pair of cross coupled p-channel enhancement mode field effect transistors.

9. A sensing circuit for a dynamic random access memory device having DC current sensing, comprising:

first and second selectively DC current biased I/O column lines;

a pair of DIGIT lines respectively coupled to independent memory cells and selectively coupled to the pair of I/O lines;

a p-sense amplifier coupled to the DIGIT lines for pulling one of the DIGIT lines to Vcc; and a n-sense amplifier coupled to the DIGIT lines for pulling the other of the DIGIT lines to ground; and a pair of cross coupled n-channel enhancement mode field effect transistors coupled to the I/O lines for controllably sinking current from the I/O line with the lower voltage to a reference voltage when the DC bias current is removed.

10. The sensing circuit of claim 9 wherein the cross coupled transistors are coupled to a switch transistor which in turn is coupled to ground, and wherein said switch transistor has a gate coupled to receive a RESTORE signal for activating the switch transistor.

11. The sensing circuit of claim 10 wherein the RESTORE signal controls the DC bias current on the I/O lines to remove the bias when the switch transistor is activated.

12. The sensing circuit of claim 10 and further comprising a gating circuit coupled between the DIGIT lines and the I/O lines for selectively coupling the sense amplifier to the I/O lines in response to a column of the memory being selected.

13. The sensing circuit of claim 12 wherein the sense amplifier further comprises a pair of isolation gates coupled between the n-sense amplifier and the p-sense amplifier.

14. A sensing circuit for a dynamic random access memory device operating under control of a row access signal, comprising:

first and second DIGIT lines coupled to independent memory cells in said memory device;

a sense amplifier selectively coupled to both of DIGIT lines for amplifying a difference in voltage between the two DIGIT lines;

first and second I/O lines selectively coupled to the DIGIT lines and resistively coupled to Vcc to provide a DC bias current; and a helper circuit coupled to the I/O lines for returning the DIGIT line having a lower voltage than the other DIGIT line to a reference voltage when said helper circuit is activated in response to the row access signal being raised and for forcing the I/O line having a higher voltage than the other I/O line to Vcc.

15. The sensing circuit of claim 14 wherein the helper circuit comprises a pair of cross coupled n-channel enhancement mode field effect transistors and a pair of cross coupled p-channel enhancement mode field effect transistors.

16. The sensing circuit of claim 14 and further comprising a gating circuit coupled between the sense amplifier and the I/O lines for selectively coupling the sense amplifier to the I/O lines in response to a column of the memory being selected.

17. The sensing circuit of claim 16 wherein the sense amplifier comprises:

a pair of DIGIT lines respectively coupled to the pair of I/O lines through the gating circuit;

a p-sense amplifier coupled to the DIGIT lines and to Vcc; and a n-sense amplifier coupled to the DIGIT lines and to ground.

18. A method for accessing a memory cell in a dynamic random access memory having sense amplifiers selectively coupled to a plurality of DIGIT lines and I/O column lines, and having a helper circuit coupled to said I/O lines, comprising the steps of:

coupling a cell to one of the DIGIT lines;

activating the sense amplifiers;

sensing the signal stored in the cell;

coupling a pair of digit lines to a pair of DC current biased I/O lines;

pulling one of the I/O lines low as a result of the DC bias current flowing through one of the sense amplifiers;

activating the helper circuit to drain current from the low voltage I/O line; and decoupling the cell from the DIGIT lines following activation of the helper circuit.

19. The method of claim 18 and further comprising the step of:

deactivating the sense amplifiers following decoupling of the cell from the DIGIT lines.

* * * * *